(12) United States Patent
Koerner et al.

(10) Patent No.: US 11,862,933 B2
(45) Date of Patent: Jan. 2, 2024

(54) METHOD OF FORMING AN ELECTRICAL METAL CONTACT AND METHOD OF PRODUCING A VERTICAL CAVITY SURFACE EMITTING LASER

(71) Applicant: TRUMPF Photonic Components GmbH, Ulm (DE)

(72) Inventors: Roman Koerner, Ulm (DE); Alexander Weigl, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 373 days.

(21) Appl. No.: 17/204,004

(22) Filed: Mar. 17, 2021

(65) Prior Publication Data

US 2021/0296853 A1 Sep. 23, 2021

(30) Foreign Application Priority Data

Mar. 20, 2020 (EP) ..................................... 20164475

(51) Int. Cl.
*H01S 5/183* (2006.01)
*H01S 5/042* (2006.01)

(52) U.S. Cl.
CPC ............ *H01S 5/0421* (2013.01); *H01S 5/183* (2013.01)

(58) Field of Classification Search
CPC ........ H01S 5/0421; H01S 5/183; H01S 5/187; H01S 5/18352
See application file for complete search history.

(56) References Cited

U.S. PATENT DOCUMENTS

| | | | |
|---|---|---|---|
| 9,705,284 B1* | 7/2017 | Cheskis | H01S 5/32316 |
| 11,271,367 B1* | 3/2022 | El-Tawil | H01S 5/18347 |
| 2005/0286595 A1 | 12/2005 | Guenter et al. | |
| 2012/0167659 A1* | 7/2012 | Besling | H01H 35/346 216/17 |
| 2015/0063393 A1* | 3/2015 | Iwata | H01S 5/34 372/45.01 |
| 2017/0256915 A1* | 9/2017 | Ghosh | H01S 5/1833 |
| 2020/0027021 A1* | 1/2020 | Sastry | G06N 20/00 |
| 2020/0303904 A1* | 9/2020 | Park | F02C 7/14 |
| 2021/0305782 A1* | 9/2021 | Roucka | H01S 5/04256 |

FOREIGN PATENT DOCUMENTS

| | | |
|---|---|---|
| EP | 1357648 A1 | 10/2003 |
| WO | 2014009843 A1 | 1/2014 |

\* cited by examiner

*Primary Examiner* — David Vu
*Assistant Examiner* — Brandon C Fox
(74) *Attorney, Agent, or Firm* — LEYDIG, VOIT & MAYER, LTD.

(57) ABSTRACT

A method of forming an electrical metal contact within a semiconductor layer stack of a vertical cavity surface emitting laser includes forming a contact hole into the semiconductor layer stack. The contact hole has a bottom and a side wall extending from the bottom. The method further includes providing a photoresist mask inside the contact hole. The photoresist mask covers the side wall of the contact hole and has an opening extending to the bottom of the contact hole. The method additionally includes wet-chemical isotropic etching the bottom of the contact hole, depositing a metal on the bottom of the contact hole, and removing the photoresist mask so that the metal on the bottom of the contact hole is left as the electrical metal contact.

12 Claims, 4 Drawing Sheets

METHOD OF FORMING AN ELECTRICAL METAL CONTACT AND METHOD OF PRODUCING A VERTICAL CAVITY SURFACE EMITTING LASER

CROSS-REFERENCE TO PRIOR APPLICATIONS

Priority is claimed to European Patent Application No. EP 20 164 475.4, filed on Mar. 20, 2020, the entire disclosure of which is hereby incorporated by reference herein.

FIELD

The present disclosure relates to a method of forming an electrical metal contact within a semiconductor layer stack of a vertical cavity surface emitting laser, and to a method of producing a vertical cavity surface emitting laser in which such method of forming an electrical metal contact of the aforementioned type is used.

BACKGROUND

A vertical cavity surface emitting laser (VCSEL) is a type of semiconductor laser diodes with laser beam emission perpendicular to the top or bottom surface. Typically, a VCSEL comprises a layer stack of semiconductor layers which may comprise one or more semiconductor materials. The layer stack typically comprises two distributed Bragg reflector (DBR) mirrors parallel to the wafer surface, and an active region comprising one or more quantum wells for the laser light generation arranged between the two DBR mirrors. The DBR mirrors typically comprise layers with alternating high and low refractive indices. The upper and lower DBR mirrors may be made of p-type doped and n-type doped materials, so as to form a p-n diode junction. The p-type and n-type regions may be embedded between the DBRs in other configurations.

In the production of a VCSEL or VCSEL array, the VCSEL layer stack is epitaxially grown on a wafer. A further part of the VCSEL fabrication process is the electrical isolation of one or more single VCSELs on the wafer. This is typically done by etching the VCSEL epitaxial layer stack, separating the p-n-junction and thus creating a certain topology on the wafer. Depending on the type of VCSEL device, the semiconductor etching can be done multiple times at different points in the process sequence, creating topologies of the top surface of the wafer including the VCSEL layer structure with altitudes up to 15 μm. In order to inject carriers into the VCSEL, electrical metal contacts to the n-type doped and p-type doped sides of the p-n-junction have to be applied.

In simple VCSEL designs, a first metal contact, e.g. the metal contact on the p-side, may be formed on top of the mesa of the VCSEL, and a second metal contact, e.g. the metal contact on the n-side, may be formed on the underside of the substrate. It is often advantageous to form also the n-contact on the epitaxial side of the substrate in order to keep the underside of the substrate free for further processing, in particular if the VCSEL is a bottom emitter. To this end, one or more contact holes are formed deep into the semiconductor layer stack for providing one or more contact areas at the bottoms of the contact holes on which a metal contact is to be formed. Contact holes on the epitaxial side of the layer stack having a depth of more than 10 μm can lead to very high surface topologies with a mechanical unstable and sensitive surface inside the contact hole, in particular at the sidewalls of the contact holes where the semiconductor layers are exposed by the etching process.

As mentioned above, to connect the p-n-junction, metal contacts need to be formed in the p-type doped part of the p-n-junction and the n-type doped part of the p-n-junction. In conventional methods, this would be done by depositing metal over the whole VCSEL layer structure. The metal is then patterned by photoresist and plasma etching. However, structuring the metal by etching is extremely critical in terms of homogeneity in a topological high structure and stopping the etching on a sensitive surface.

Another conventional method is a lift-off process sequence to form metal contacts at the bottom of the contact hole. However, lift-off requires a lot of free space on the bottom of the contact hole, first to provide large undercut of the photoresist and second due to metal-tails in a non-conformal evaporation/sputtering metal lift-off process. The additional space can reach up to 15 μm on each side of the contact hole, which, on the design side, stretches the whole chip layout especially for VCSEL arrays where multiple contact holes are needed.

For metal contacts, additional cleaning procedures are essential to achieve low contact resistivity. Ex-situ cleaning sequences using $H_2O_2$, $H_2SO_4$, HF or HCl are known to sufficiently remove native $Al_2O_3$ films. The native oxide at the contact area can thus be sufficiently removed. Different oxidation rates of the semiconductor materials at the side walls, e.g. GaAs and AlGaAs, also cause different oxide removal rates at the side walls of the contact holes. This leads to formation of free standing GaAs membranes with high risk of mechanical cracking and voids inside the following passivation of the contact hole.

Thus, there is a need in an improved method of forming an electrical metal contact within a semiconductor layer stack of a vertical cavity surface emitting laser.

SUMMARY

In an embodiment, the present invention provides a method of forming an electrical metal contact within a semiconductor layer stack of a vertical cavity surface emitting laser. The method includes forming a contact hole into the semiconductor layer stack, the contact hole having a bottom and a side wall extending from the bottom. The method further includes providing a photoresist mask inside the contact hole. The photoresist mask covers the side wall of the contact hole and has an opening extending to the bottom of the contact hole. The method additionally includes wet-chemical isotropic etching the bottom of the contact hole, depositing a metal on the bottom of the contact hole, and removing the photoresist mask so that the metal on the bottom of the contact hole is left as the electrical metal contact.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following:

FIG. 1 shows a sketch of a semiconductor layer stack of a vertical cavity surface emitting laser in a processing stage of a method of forming an electrical metal contact, wherein FIG. 1 shows a side view of the layer stack;

DETAILED DESCRIPTION

Figure 1:
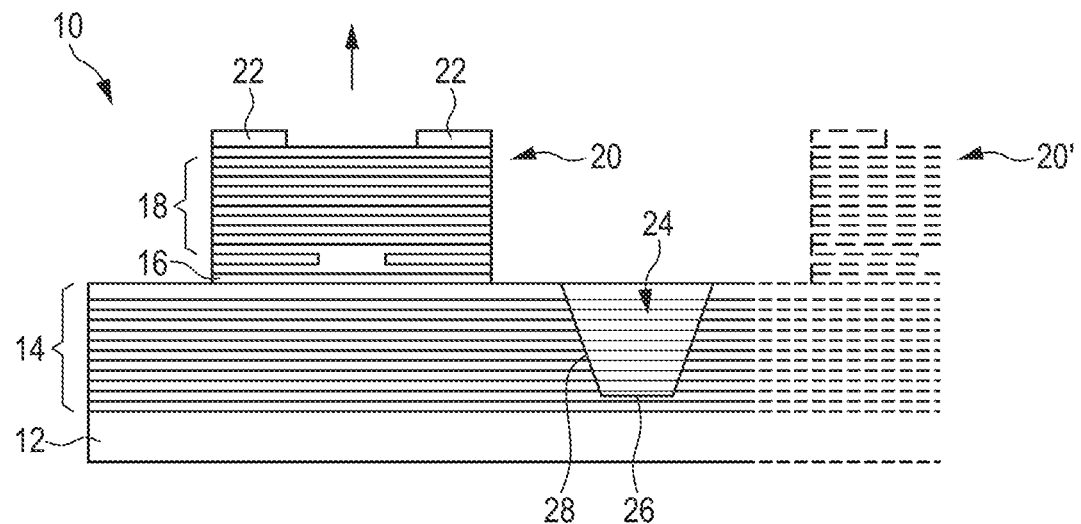

The present disclosure provides a method of forming an electrical metal contact within a semiconductor layer stack of a vertical cavity surface emitting laser which overcomes at least a part of the above-mentioned disadvantages.

The present disclosure further provides a method of fabricating a vertical cavity surface emitting laser which uses such a method of forming an electrical metal contact.

According to a first aspect, a method of forming an electrical metal contact within a semiconductor layer stack of a vertical cavity surface emitting laser is provided, the method comprising:
  forming a contact hole into the semiconductor layer stack, the contact hole having a bottom and the side wall extending from the bottom,
  providing a photoresist mask inside the contact hole, the photoresist mask covering the side wall of the contact hole, the photoresist mask having an opening extending to the bottom of the contact hole,
  wet-chemical isotropic etching the bottom of the contact hole,
  depositing a metal on the bottom of the contact hole, and
  removing the photoresist mask so that the metal on the bottom of the contact hole is left as the electrical metal contact.

The method uses a photoresist mask which advantageously protects the sensitive semiconductor layers exposed at the side wall of the contact hole in the subsequent etching process and may also be used in a later lift-off process. The photoresist mask is also suitable to provide protection of the side walls when oxide is to be removed before metal deposition.

The method comprises wet-chemical isotropic etching of the semiconductor material at the bottom of the contact hole while the side wall of the contact hole is masked by the photoresist mask. The wet-chemical isotropic etching may be different from the etching process used for making the contact hole in the semiconductor layer stack. The wet-chemical isotropic etching of the bottom of the contact hole inherently generates an undercut below the lower end of the photoresist mask and smoothens the initially sharper transition from the bottom of the contact hole to the side wall of the contact hole. The smoother transition from the side wall to the bottom of the contact hole advantageously enables a self-aligning of the metal contact when the metal is deposited on the bottom of the contact hole. After the wet-chemical etching, the side wall at the transition to the bottom may be less steep than in an outer region of the contact hole. The self-aligned metal contact deposition method may produce a step-like side wall profile of the contact hole, consisting of a steeper portion and a flatter portion of the side wall. The steeper side wall portion is situated at the outer hole area, and an e.g. 40° to 50° degree profile is produced at the transition to the bottom of the contact hole.

Wet-chemical etching may be performed using a combination of an oxidant, with comparable oxidation rates of the different semiconductor materials, with an acid. The different semiconductor materials may be AlGaAs and GaAs.

The metal deposited on the bottom of the contact hole may be a metal stack comprising different metal materials, e.g. Ti, Ag, Pt, Au. After metal deposition, the lift-off process leaves a metal contact on the bottom of the contact hole, which is self-aligned due to the wet-chemical etching process.

Preferably, the photoresist mask comprises a positive-tone photoresist.

A positive photoresist has some advantages over a negative photoresist. A positive photoresist can be structured more accurate without the need to form sufficient undercut. This in turn provides an advantage in terms of smaller chip size and layout dimensions. Negative-tone photoresists which are chemically stabilized need strong mechanical treatment, e.g. megasonic treatment, to provide a sufficient lift-off. Furthermore, high layout topologies degrade the megasonic penetration inside the contact hole and prohibit the lift-off possibility. Positive-tone photoresist has the advantage that it can be chemically dissolved and can thus provide 100% lift-off rate inside the contact hole. Thus, removing the photoresist mask after metal deposition preferentially comprises a chemically induced lifting off of the photoresist mask, if the photoresist is a positive resist. Nevertheless, a negative photoresist may be used in the method as well.

In addition, the photoresist thickness is not constrained by the metal thickness of the deposited metal. Due to good solubility and photoresist removal rates, photoresist thicknesses below the metal thickness can be used. The process sequence of the method therefore supports thick contact metal layers for reduced thermal resistance.

Providing the photoresist mask in the contact hole may comprise lithographically structuring the photoresist mask to provide the opening through the photoresist mask to the bottom of the contact hole.

The method may further comprise, prior to depositing the metal, removing oxide from the bottom of the contact hole.

After the chemical etching, the surface of the contact hole at the bottom may be left oxidized. In order to form a clean interface for the metal to be deposited, oxide should be removed. Preferably, oxide is removed by in-situ Ar-sputtering before metal deposition.

The method may further comprise, after lift-off of the photoresist mask, applying an electrical passivation layer on the side wall of the contact hole.

The smooth transition from the side wall to the bottom of the contact hole due to the isotropic wet-chemical etching process supports sufficient coverage of an electrical passivation layer and further metallization processes on top of the electrical contact.

The semiconductor layer stack may comprise a distributed Bragg reflector, and the contact hole may be formed into the distributed Bragg reflector.

The semiconductor layer stack may be arranged on a substrate, and the contact hole may be formed into the semiconductor layer stack down to a semiconductor layer of the layer stack above the substrate, or the contact hole may be formed into the semiconductor layer stack down to the substrate.

In each case, the contact hole may be formed with a depth, from an upper end of the contact hole to the bottom, of more than 10 µm.

The contact hole may be formed using etching, in particular non-selective etching.

The method of forming an electrical contact in a layer stack of a vertical cavity surface emitting laser results in a defined positioning of the electrical contact inside the epitaxial layer stack and produces no harm to the etched epitaxial structure. Native oxide films in the contact hole may be removed. A lift-off procedure may be used using a positive-tone photoresist. The resulting electrical metal contact is self-aligned in the contact hole. The electrical metal contact may be thus formed inside a topological high contact hole with a depth up to 15 µm with shallow side walls at an angle of about 40°-45° at the transition from the outer region of the contact hole to the bottom thereof. A single lithographic mask, in particular a positive-tone photoresist mask, may be used.

According to a second aspect, a method of producing a vertical cavity surface emitting laser is provided, the method comprising:
  providing a semiconductor layer stack, and
  forming an electrical metal contact within the semiconductor layer stack using a method according to the first aspect.

The method according to the second aspect may have the same embodiments as described with respect to the method according to the first aspect. The method according to the second aspect may have the same advantages and embodiments as the method according to the first aspect.

FIG. 1 shows a layer stack 10 in a stage of a method of fabricating a vertical cavity surface emitting laser (VCSEL). The method includes a method of forming an electrical metal contact within the semiconductor layer stack 10 described herein.

In the method of fabricating a VCSEL, the layer stack 10 may be epitaxially grown on a substrate 12, e.g. a GaAs substrate. On the substrate 12, an arrangement of semiconductor layers 14 is epitaxially grown. The layers 14 may form a first (lower) distributed Bragg reflector (DBR). The layers 14 forming the DBR may have alternating high and low refractive indices. For example, the layers 14 may comprise alternating AlGaAs/GaAs layers. The layers 14 may be n-doped.

An active region 16 for laser light emission is arranged on the layers 14 forming the lower DBR. The active region 16 may comprise one or more quantum wells, e.g. comprising GaAs. An arrangement of further layers 18 is grown on the active region 16. The layers 18 may form a second (upper) DBR. The layers 18 may have alternating high and low refractive indices. The layers 18 forming the second DBR may comprise AlGaAs/GaAs layers. The second DBR formed by the layers 18 may be p-doped. The layers 14 and the layers 18 thus form a p-n-junction in the layer stack. In case the VCSEL to be produced is a top emitter, the reflectivity of the second DBR is lower than the reflectivity of the first DBR. In case the VCSEL to be produced is a bottom emitter, the reflectivity of the first DBR is lower than the reflectivity of the second DBR.

Initially, the layer stack 10 may be formed on the substrate with an even surface topology (not shown). After the layer stack 10 has been grown, the layer stack 10 may be etched to form a mesa 20 and to separate the n-type doped and p-type doped layers 14 and 18. An oxide aperture 19 may be formed after the mesa 20 is created.

FIG. 1 shows with broken lines that the etching process for forming the mesa structure can produce a plurality of mesa structures 20, 20', . . . , e.g. to produce a VCSEL array on a single wafer.

To connect the p-n-junction, metal contacts need to be formed in the p-type doped part of the p-n-junction and the n-type doped part of the p-n-junction. For the p-side, a ring electrode 22 may be formed on top of the layer stack 10. An n-side electrical metal contact could be formed on the underside of the substrate 12. It may be however advantageous to form the n-side electrical metal contact on the epitaxy side of the layer stack 10 to keep the underside of the substrate free for further processing. Forming both, the p-side and n-side contacts, on the epitaxy side of the layer stack requires to etch a contact hole 24 into the layer stack 10. In the present embodiment, the contact hole 24 is formed in the first DBR (layers 14). Thus, as can be seen in FIG. 1, a high aspect ratio etching of the epitaxial layers of the layer stack 10 is required.

Figure 2:
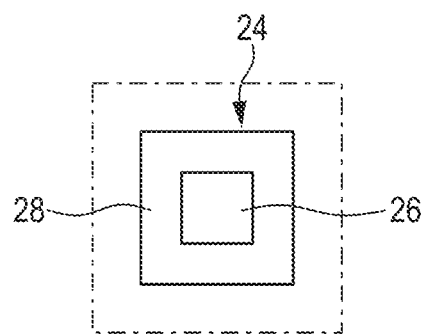
FIG. 2 shows a top plan view on a contact hole in the semiconductor layer stack in FIG. 1.

Etching the layer stack 10 to form the mesa 20 and/or to form the contact hole 24 may be performed by non-selective etching. The contact hole 24 may be etched with an etching depth in a range of more than 10 µm, e.g. the etching depth may be as high as 13-15 µm. FIG. 2 shows the contact hole 24 including the side wall 28 and the bottom 26 in a top plan view. The side wall 28 may have a tapering shape seen from the top to the bottom 26 of the contact hole 24 as a result of the etching process for forming the contact hole 24.

The contact hole 24 comprises a bottom 26 and a side wall 28 extending from the bottom 26. An electrical metal contact is to be formed on the bottom 26 of the contact hole 24. Due to the etching process for forming the contact hole 24, the side wall 28 of the contact hole 24 at which the layers 14 are exposed due to the etching process, may be mechanically unstable and sensitive to the processing steps for forming the electrical metal contact on the bottom 26 of the contact hole 24.

With reference to FIGS. 3 to 8, a method of forming an electrical metal contact in the layer stack 10 on the bottom 26 of the contact hole 24 will be described. In FIGS. 3 to 8, the layer structure of the layers 14 and the substrate 12 are not shown.

Figure 3:
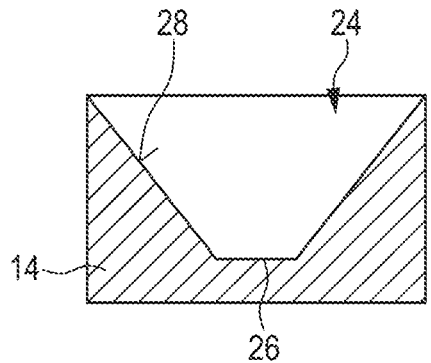
FIG. 3 shows the contact hole in a side view in the processing stage in FIG. 1.

FIG. 3 shows a portion of the layer stack 10 in the region of the contact hole 24 only. The contact hole 24 with the bottom 24 and the side wall 28 may have been formed by a non-selective etching process. Etching the contact hole 24 may be performed such that the contact hole 24 is formed into the semiconductor layer stack 10 down to the substrate 12 or down to a semiconductor layer of the layer stack 10, e.g. down to one of the lower layers of the layers 14 of the lower DBR.

Figure 4:
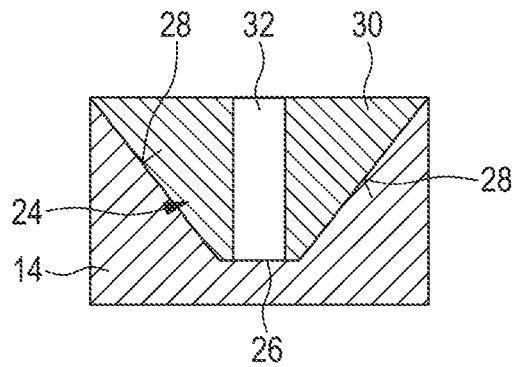
FIG. 4 shows the contact hole in a further processing stage.

When the contact hole 24 has been formed, a photoresist mask 30 is provided inside the contact hole 24 as shown in FIG. 4. The photoresist mask 30 especially comprises a positive-tone photoresist. A positive-tone photoresist can be lithographically structured in a very accurate manner. In the method of forming an electrical contact on the bottom 26 of the contact hole 24, the photoresist mask 30 may be structured, in particular lithographically structured, to provide an opening 32 through the photoresist mask 30 down to the bottom 26 of the contact hole 24. The photoresist mask 30 covers the side wall 28 of the contact hole completely in the processing stage in FIG. 4.

Figure 5:
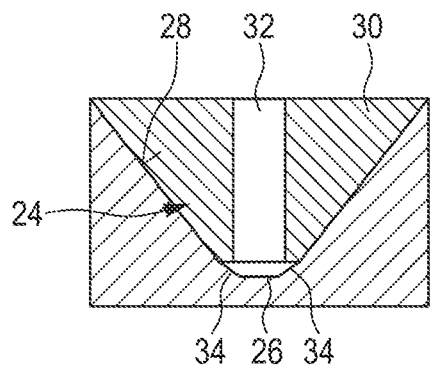
FIG. 5 shows the contact hole in a further processing stage.
Figure 6:
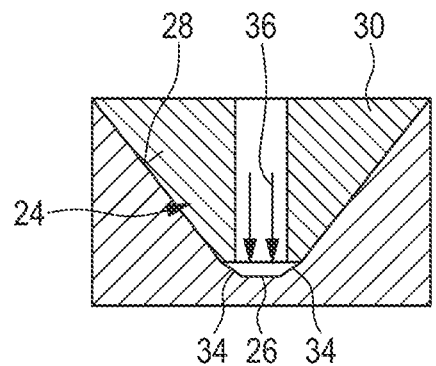
FIG. 6 shows the contact hole in a further processing stage.

Next, an isotropic wet-chemical etching of the bottom 26 of the contact hole 24 is performed as shown in FIG. 5. The isotropic wet-chemical etching of the semiconductor material of the layers 14 in combination with the photoresist mask 30 inherently generates an undercut 34 below the lower end of the photoresist mask 30. The isotropic wet-chemical etching may be performed by using an oxidant, e.g. $H_2O_2$ with comparable oxidation rates of e.g. AlGaAs and GaAs in combination with an acid (e.g. $H_2SO_4$; concentration of 1:40) which may provide isotropic etching rates of around 1 μm/min.

The wet-chemical etching smoothens the transition from the bottom 26 of the contact hole 24 to the side wall 28, i.e. a side wall portion 34 of the side wall close to the bottom is not as steep as the side wall 28 in an outer region of the contact hole 24. The flatter side wall portion 34 is generated by the process of isotropic wet-chemical etching of the bottom 26. Thus, the side wall 28 may obtain a step-like side wall profile in the region of the transition of the side wall 28 to the bottom 26, with a steeper slope in an outer region of the contact hole 24 and a flatter slope close to the bottom of the contact hole 24.

The isotropic wet-chemical etching process may result in an oxidized surface of the bottom 26 of the contact hole 24. For the subsequent metal deposition, the surface of the bottom 26 should be cleaned from any oxides. Removing the oxides from the bottom 26 of the contact hole 24 is preferentially performed by argon (Ar)-ion in-situ sputtering as indicated by arrows 36 in FIG. 6. The photoresist mask 30 protects the sensitive side wall 28 of the contact hole 24 in this cleaning process.

Figure 7:
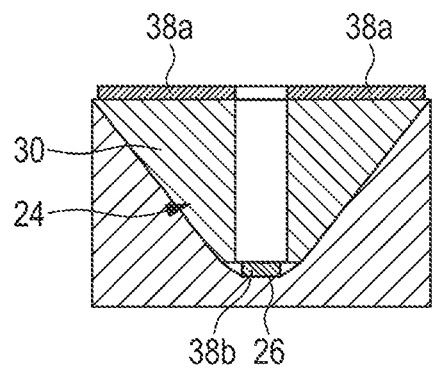
FIG. 7 shows the contact hole in a further processing stage.

After the semiconductor surface of the bottom 26 (and the side wall portions 34) have been cleaned from the oxide, a metal is deposited on the bottom 26 of the contact hole 24. FIG. 7 shows the processing stage, where one or more metals 38 have been deposited. The metal or metals deposited cover the photoresist mask 30 as well as the bottom 26 of the contact hole 24. An advantage of the undercut below the photoresist mask 30 produced by the isotropic wet-chemical etching process (FIG. 5) is that the metal film during deposition easily tears off at the lower edge of the photoresist mask 30. The metal layer 38*b* on the bottom 26 of the contact hole 24 self-aligns on the bottom 26 in the correct position.

The positive-tone photoresist can be chemically dissolved and thus can provide 100% lift-off rate inside the contact hole. Therefore, the photoresist mask 30 is also used as a lift-off mask in the metal-stack evaporation process of depositing a metal on the bottom 26 of the contact hole 24. After chemically induced lift-off processing by simply dissolving the photoresist mask 30, a metal contact 40 is left on the bottom 26 of the contact hole 24 which is self-aligned in the contact hole 24. The sensitive side wall 28 has not been affected by virtue of the processing sequence described above.

In further steps, an electrical passivation layer may be deposited on the side wall 28 of the contact hole 24, and further metallizations may be applied on top of the metal contact 40 up to the upper end of the contact hole 24.

The smooth transition from the side wall 28 to the bottom 26 of the contact hole 24, i.e. the flatter side wall portions 34 support sufficient coverage of the electrical passivation layer and further metallization.

Figure 8:
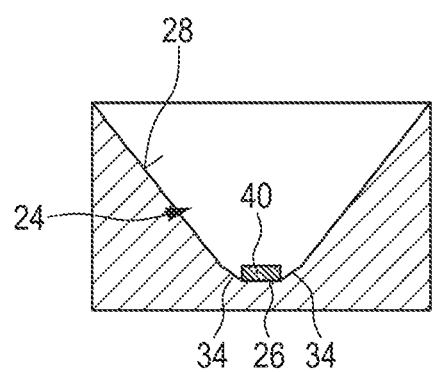
FIG. 8 shows the contact hole in a further processing stage.
Figure 9:
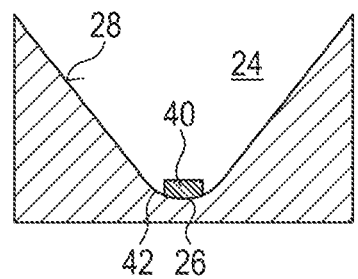
FIG. 9 shows a contact hole with an electrical metal contact formed therein.
Figure 10:
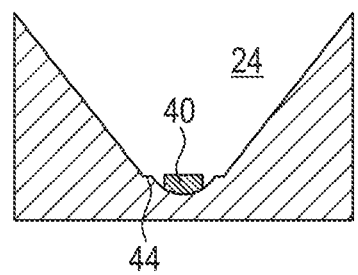
FIG. 10 shows a contact hole with an electrical metal contact formed therein.
Figure 11:
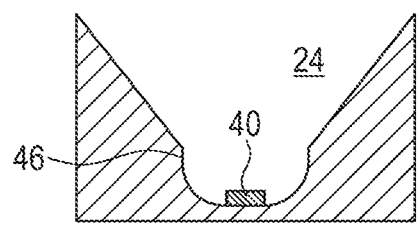
FIG. 11 shows a contact hole with an electrical metal contact formed therein.

The smooth transition from the side wall 28 in the outer area of the contact hole 24 to the bottom 26 of the contact hole 24 is an advantageous effect of the isotropic wet-chemical etching of the semiconductor material in the area of the bottom 26 of the contact hole 24. In the final VCSEL, the self-aligned metal contact deposition method as described above is visible by a side wall profile as shown in FIG. 8, or as shown in FIGS. 9 to 11. The actual shape of the lower portion of the contact hole 24, in particular at the transition from the side wall 28 in the outer area of the contact hole 24 to the bottom 26 of the contact hole 24 may depend on the etching rate, etching angle and the substances used in the isotropic wet-chemical etching process. FIG. 9 shows a rounded transition 42 from the side wall 28 to the bottom 26. FIG. 10 shows a stepped transition 44. FIG. 11 shows a stepped transition with a larger rounded area. The bottom 26 may have a round shape in each case or may be straight.

Figure 12:
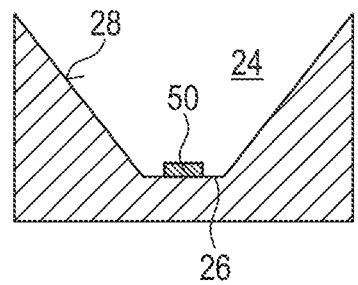
FIG. 12 shows a contact hole with an electrical metal contact formed therein according to the prior art.

In contrast, FIG. 12 shows an electrical contact 50 formed in the contact hole 24 by a conventional method, where the side wall 28 does not exhibit a side wall portion or transition like side wall portions 34, 42, 44, 46. The transition from the side wall 28 in an outer region to the bottom 26 of the contact hole 24 in FIG. 12 thus is more or less sharp and not smooth.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method of forming an electrical metal contact within a semiconductor layer stack of a vertical cavity surface emitting laser, the method comprising:

forming a contact hole into the semiconductor layer stack, the contact hole having a bottom and a side wall extending from the bottom, wherein the contact hole is formed with a depth of more than 10 μm, providing a photoresist mask inside the contact hole, the photoresist mask covering the side wall of the contact hole, the photoresist mask having an opening extending to the bottom of the contact hole, wet-chemical isotropic etching the bottom of the contact hole, depositing a metal on the bottom of the contact hole, and removing the photoresist mask so that the metal on the bottom of the contact hole is left as the electrical metal contact.

2. The method of claim 1, wherein the photoresist mask comprises a positive-tone photoresist.

3. The method of claim 1, further comprising, prior to depositing the metal on the bottom of the contact hole, removing oxide from the bottom of the contact hole.

4. The method of claim 3, wherein removing oxide from the bottom of the contact hole comprises Ar-sputtering.

5. The method of claim 1, wherein providing the photoresist mask in the contact hole comprises lithographically structuring the photoresist mask to provide the opening through the photoresist mask to the bottom of the contact hole.

6. The method of claim 1, further comprising, after removing the photoresist mask, applying an electrical passivation layer on the side wall of the contact hole.

7. The method of claim 1, wherein removing the photoresist mask comprises a chemically induced lifting off of the photoresist mask.

8. The method of claim 1, wherein the semiconductor layer stack comprises a distributed Bragg reflector, and the contact hole is formed into the distributed Bragg reflector.

9. The method of claim 1, wherein the semiconductor layer stack is arranged on a substrate, and wherein the contact hole is formed into the semiconductor layer stack down to a semiconductor layer of the layer stack above the substrate.

10. The method of claim 1, wherein the semiconductor layer stack is arranged on a substrate, and wherein the contact hole is formed into the semiconductor layer stack down to the substrate.

11. The method of claim 1, wherein the contact hole is formed using etching, in particular non-selective etching.

12. A method of producing a vertical cavity surface emitting laser, the method comprising:

providing a semiconductor layer stack, and forming an electrical metal contact within the semiconductor layer stack using the method according to claim 1.

* * * * *